(12) United States Patent
Ye (10) Patent No.: US 10,802,362 B2
(45) Date of Patent: Oct. 13, 2020

(54) DISPLAY PANEL AND MANUFACTURING METHOD FOR THE SAME

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Yanxi Ye, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 42 days.

(21) Appl. No.: 16/234,394

(22) Filed: Dec. 27, 2018

(65) Prior Publication Data

US 2020/0033660 A1    Jan. 30, 2020

Related U.S. Application Data

(63) Continuation of application No. PCT/CN2018/105640, filed on Sep. 14, 2018.

(30) Foreign Application Priority Data

Jul. 25, 2018    (CN) .......................... 2018 1 0824451

(51) Int. Cl.
*G02F 1/1362* (2006.01)
*H01L 27/12* (2006.01)
(Continued)

(52) U.S. Cl.
CPC ........ *G02F 1/13624* (2013.01); *G02F 1/1368* (2013.01); *G02F 1/133345* (2013.01); *G02F 1/134309* (2013.01); *G02F 1/136209* (2013.01); *G02F 1/136286* (2013.01); *H01L 27/1248* (2013.01); *G02F 1/134363* (2013.01); *G02F 1/136227* (2013.01);
(Continued)

(58) Field of Classification Search
None
See application file for complete search history.

(56) References Cited

U.S. PATENT DOCUMENTS

2015/0243686 A1*  8/2015  Lee ..................... H01L 27/1248
                                                                        257/43
2018/0143471 A1*  5/2018  Park .................. G02F 1/136286
2018/0190631 A1*  7/2018  Kim ...................... H01L 27/156

* cited by examiner

*Primary Examiner* — Steven M Christopher
(74) *Attorney, Agent, or Firm* — Leong C. Lei (57) ABSTRACT

A display panel and manufacturing method for the same. The display panel includes an array substrate, a passivation layer, an organic planarization layer, a first color resist layer and a second color resist layer and an organic planarization layer. Each sub-pixel circuit includes at least two thin-film transistors; at least two via holes are prepared on the passivation layer and the organic planarization layer. The first color resist layer includes a first color resist region and multiple second color resist regions connected thereto. A projection of the first color resist region on the array substrate is located at two sides of the sub-pixel circuit. Each second color resist region is located above the at least two thin-film transistors; the second color resist layer is stacked above the second color resist region. The first color resist layer will not crack, and the main region spacer can reach a desired height.

11 Claims, 8 Drawing Sheets

(51) Int. Cl.
*G02F 1/1368* (2006.01)
*G02F 1/1333* (2006.01)
*G02F 1/1343* (2006.01)

(52) U.S. Cl.
CPC ............ *G02F 2001/133357* (2013.01); *G02F 2001/134345* (2013.01); *G02F 2001/136222* (2013.01); *G02F 2201/121* (2013.01); *G02F 2201/123* (2013.01)

DISPLAY PANEL AND MANUFACTURING METHOD FOR THE SAME

CROSS-REFERENCE TO RELATED APPLICATION

This application is a continuing application of PCT Patent Application No. PCT/CN2018/105640, entitled "DISPLAY PANEL AND MANUFACTURING METHOD FOR THE SAME", filed on Sep. 14, 2018, which claims priority to China Patent Application No. 201810824451.5 filed on Jul. 25, 2018, both of which are hereby incorporated in its entireties by reference.

FIELD OF THE INVENTION

The present invention relates to a display technology field, and more particularly to a display panel and a manufacturing method for the same.

BACKGROUND OF THE INVENTION

BPS (Black photo spacer, black gap control material) technology is a technology in LCD technology that combines two processes of BM (black matrix) and PS (gap control). According to one of the division methods, the BPS technology is divided into 3 tone, 2 tone, and 1 tone technologies. The 3 tone, 2 tone, 1 tone represent different transmittances of mask. The 3 tone and 2 tone indicate that in BPS technology, the corresponding mask uses 3 kinds and 2 kinds of transmittances, both of which use semi-transparent film. The 1 tone uses only one transmission rate, which is 100% transmittance. Since 1 tone does not use a semi-transparent film, the corresponding BPS material has a very high stability after exposure and development, so that the 1 tone technology is a better choice for BPS technology.

A pixel design containing three TFTs (Thin Film Transistors) in one pixel is a 3T technology (or a 3T pixel structure). The 3T technology is a technology for the HVA mode. In the HVA mode, one TFT controls a main region of the pixel, one TFT controls a sub-region, and one TFT controls a share charge of the main region and the sub-region. The 3T structure can improve the display failure of pixels in HVA mode.

Figure 1:
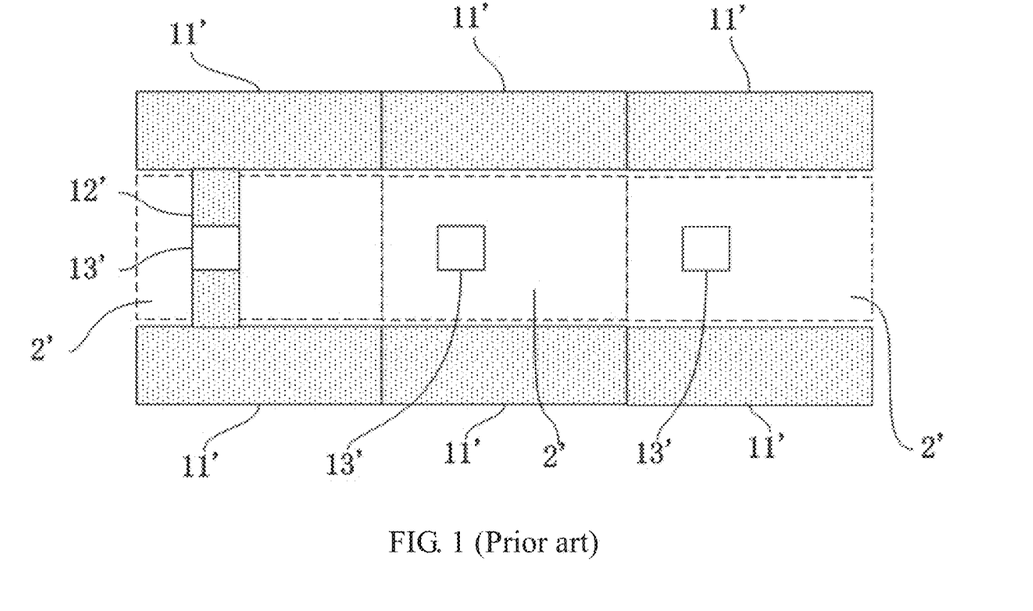
FIG. 1 is a schematic diagram of a color resist layer of a TFT pixel structure in the background art provided by the present invention.

The 1 tone BPS technology places both a main region spacer and a sub-region spacer at a black matrix above a gate line of the array substrate. The main region spacer is implemented using a two-layer color resist stack with a layer of BPS material. The sub-region spacer is implemented using a layer of color resist plus a layer of BPS material. The color resist of the region above the remaining gate lines is excavated. These regions have only one layer of BPS material to act as a black matrix. The pixel structure of a normal TFT, the color resist design in this region is shown in FIG. 1. The lower color resist of the spacer of the main region generally uses a color resist 12' and is connected to the color resist 11' at both ends of the pixel to form a bridge structure. The sub-region spacer is an island structure color resist 13', and the color resist 13' is located above the sub-pixel circuit 2.

The color resist 12' is generally above the TFT because the topography on the TFT is the highest. The color resist 12' of the bridge structure has two advantages over the color resist 13' of the island structure. First, the color resist 12' of the bridge structure is less likely to be broken. Second, the shape of the bridge structure causes the organic layer stacked on it to reduce the leveling of the materials on both sides, and it is easier to form a high topography, so that a step is formed between the main region spacer and the sub-region spacer.

In the pixel structure of the three TFTs, the color resist layers above the corresponding three TFTs need to be excavated to form three via holes for the connection of source and drain of the TFT and the pixel electrode above the color resist layer or the common electrode. Therefore, the main region spacer of the 3T pixel structure is formed on the TFT, and the color resist of the main region spacer and the color resist on both sides of the sub-pixel circuit cannot be connected in a bridge structure such that the color resist of the main region spacer is easily to crack, which in turn create a risk that the main region spacer will not reach the desired height.

SUMMARY OF THE INVENTION

In order to solve the above technical problem, the present invention provides a display panel and a manufacturing method for the same, wherein the first color resist layer corresponding to the main region spacer is not easily to generate a crack, and the main region spacer can be ensured to reach a desired height.

The present invention provides a display panel, comprising: an array substrate, a passivation layer on the array substrate, an organic planarization layer on the passivation layer, a first color resist layer and a second color resist layer, and the first color resist layer and the second color resist layer are clamped between the passivation layer and the organic planarization layer; wherein the array substrate includes multiple sub-pixel circuits, and each sub-pixel circuit includes at least two thin-film transistors, at least two via holes are prepared on the passivation layer and the organic planarization layer; wherein the first color resist layer includes a first color resist region and multiple second color resist regions connected to the first color resist region, and the multiple second color resist regions are respectively located above a first portion of the sub-pixel circuit of the multiple sub-pixel circuits; and wherein a projection of the first color resist region on the array substrate is located at two sides of the sub-pixel circuit, and each second color resist region is located above the at least two thin-film transistors, the second color resist layer is stacked above the second color resist region.

Preferably, the second color resist region has a T-shape, the second color resist region and the at least two via holes are staggered, and the at least two via holes are distributed at both sides of the second color resist region.

Preferably, the first color resist layer further includes multiple island-shaped third color resist regions, and the multiple island-shaped third color resist regions are located above the thin-film transistor of a second portion of sub-pixel circuit of the multiple sub-pixel circuits, and the third color resist region and the at least two via holes are staggered.

Preferably, the multiple island-shaped third color resist regions and the multiple second color resist regions are mutually intersected, and the number of the second color resist regions is less than the number of the third color resist regions.

Preferably, a pixel electrode and a first common electrode are further disposed on the organic planarization layer, and the pixel electrode and the first common electrode are connected to a drain or a source of the thin-film transistor through the via hole on the passivation layer and the organic planarization layer.

Preferably, a black matrix is disposed above the organic planarization layer, and the black matrix is located above a gate line on the array substrate.

Preferably, each sub-pixel circuit further includes a second common electrode located at both sides of the at least two thin-film transistors, the second common electrode and gates of the at least two thin-film transistors are made of a same metal layer.

The present invention also provides a display panel, comprising: an array substrate, a passivation layer on the array substrate, an organic planarization layer on the passivation layer, a first color resist layer and a second color resist layer, and the first color resist layer and the second color resist layer are clamped between the passivation layer and the organic planarization layer; wherein the array substrate includes multiple sub-pixel circuits, and each sub-pixel circuit includes at least two thin-film transistors, at least two via holes are prepared on the passivation layer and the organic planarization layer; wherein the first color resist layer includes a first color resist region and multiple second color resist regions connected to the first color resist region, and the multiple second color resist regions are respectively located above a first portion of the sub-pixel circuit of the multiple sub-pixel circuits; wherein a projection of the first color resist region on the array substrate is located at two sides of the sub-pixel circuit, and each second color resist region is located above the at least two thin-film transistors, the second color resist layer is stacked above the second color resist region; wherein the second color resist region has a T-shape, the second color resist region and the at least two via holes are staggered, and the at least two via holes are distributed at both sides of the second color resist region; and wherein the first color resist layer further includes multiple island-shaped third color resist regions, and the multiple island-shaped third color resist regions are located above the thin-film transistor of a second portion of sub-pixel circuit of the multiple sub-pixel circuits, and the third color resist region and the at least two via holes are staggered.

Preferably, the multiple island-shaped third color resist regions and the multiple second color resist regions are mutually intersected, and the number of the second color resist regions is less than the number of the third color resist regions.

Preferably, a pixel electrode and a first common electrode are further disposed on the organic planarization layer, and the pixel electrode and the first common electrode are connected to a drain or a source of the thin-film transistor through the via hole on the passivation layer and the organic planarization layer.

Preferably, a black matrix is disposed above the organic planarization layer, and the black matrix is located above a gate line on the array substrate.

Preferably, each sub-pixel circuit further includes a second common electrode located at both sides of the at least two thin-film transistors, the second common electrode and gates of the at least two thin-film transistors are made of a same metal layer.

The present invention also provides a manufacturing method for a display panel, comprising steps of: providing an array substrate, wherein the array substrate includes multiple sub-pixel circuits, and each sub-pixel circuit includes at least two thin-film transistors; forming a passivation layer on the array substrate; forming a first color resist material layer, and patterning the first color resist material layer to obtain a first color resist layer, wherein the first color resist layer includes a first color resist region and multiple second color resist regions connected to the first color resist region, the multiple second color resist regions are respectively located above a first portion of the multiple sub-pixel circuits, a projection of the first color resist region on the array substrate is located at two sides of the sub-pixel circuit, each of the second color resist region is located above the at least two thin-film transistors, a projection of the second color resist region on the array substrate is not overlapped with electrodes of the at least two thin-film transistors of the sub-pixel circuit for connecting the pixel electrode or the first common electrode; forming a second color resist material layer on the passivation layer, wherein the second color resist material layer covers the first color resist layer, and patterning the second color resist material layer to obtain a second color resist layer, wherein the second color resist layer is stacked above the second color resist region; forming an organic planarization layer on the passivation layer, and the organic planarization layer covers the passivation layer; and etching to form at least two via holes on the organic planarization layer and the passivation layer above the sub-pixel circuit, and the at least two via holes above each sub-pixel circuit are corresponding to electrodes of the at least two thin-film transistors of the sub-pixel circuit for connecting the pixel electrode or the first common electrode.

Preferably, the method further comprises steps of: forming a pixel electrode and a first common electrode on the organic planarization layer, and the pixel electrode and the first common electrode are connected to a source or a drain of the thin-film transistor through the via holes on the organic planarization layer and the passivation layer.

Preferably, the method further comprises steps of: using a black light-shielding material to manufacture a black matrix on the organic planarization layer, and the black matrix covers the pixel electrode and the first common electrode, and the black matrix is located above gate line of the array substrate.

The implementation of the present invention has the following beneficial effects: in the display panel provided by the invention, the second color resist region on the first color resist layer is connected to the first color resist region on both sides of the sub-pixel circuit to form a bridge structure, and each second color resist region is further located above the at least two thin-film transistors to ensure that the region of the second color resist region is not too small. This can avoid the first color resist layer from breaking, and can also avoid the material leveling on both sides of the film layer stacked on the second color resist region. It is easy to form a higher topography, which is convenient to reach the expected topography height, and can form a step difference with the sub-region spacer.

BRIEF DESCRIPTION OF THE DRAWINGS

In order to more clearly illustrate the embodiments of the present invention or the technical solutions in the prior art, the drawings used in the embodiments or the prior art description will be briefly introduced below. Obviously, the drawings in the following description are only some embodiments of the present invention. For those of ordinary skill in the art, without creative labor, other drawings can also be obtained from these figures.

DETAILED DESCRIPTION OF PREFERRED EMBODIMENTS

Figure 2:
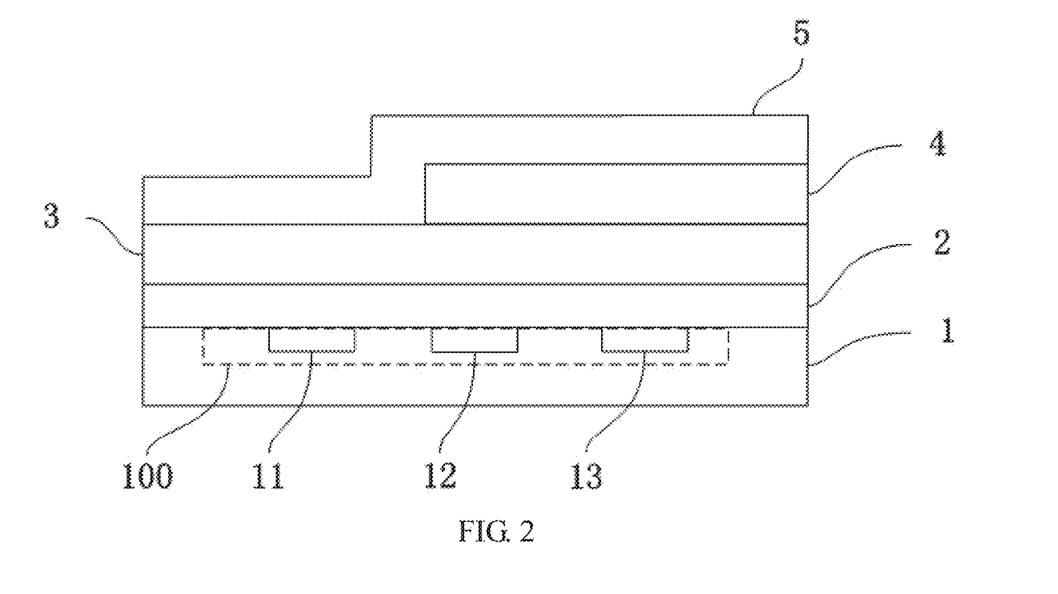
FIG. 2 is a schematic diagram of the positions of the first color resist layer and the second color resist layer provided by the present invention.

The present invention provides a display panel, as shown in FIG. 2, the display panel includes: an array substrate 1, a passivation layer 2 on the array substrate 1, an organic planarization layer 5 on the passivation layer 2. The display panel further includes a first color resist layer 3 and a second color resist layer 4, the first color resist layer 3 and the second color resist layer 4 are clamped between the passivation layer 2 and the organic planarization layer 5. The pixel structure in the present invention may be a 3T pixel structure, that is, each sub-pixel circuit includes three thin-film transistors.

Figure 3:
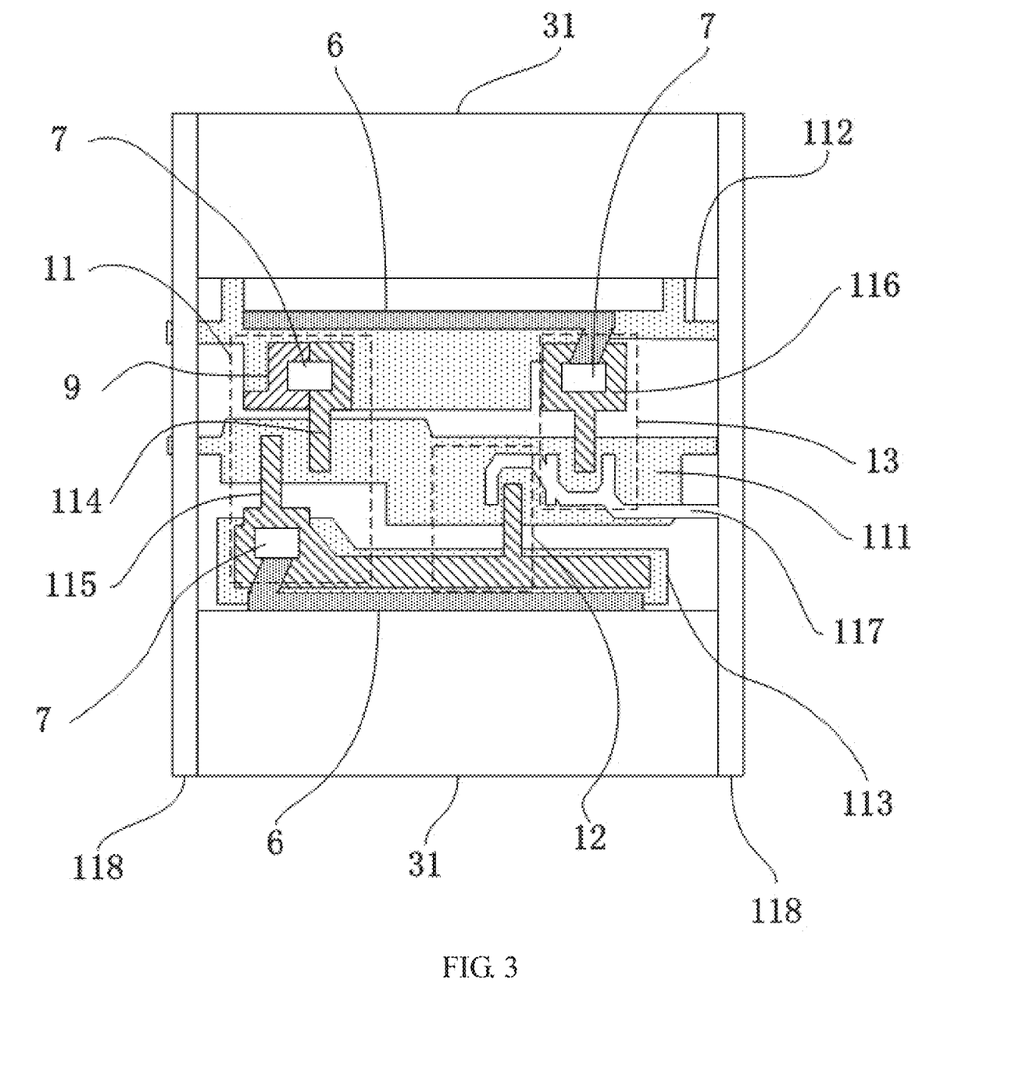
FIG. 3 is a schematic diagram of each electrode in the display panel viewed from a top view provided by the present invention.

The array substrate 1 includes multiple sub-pixel circuits 100, and each sub-pixel circuit 100 includes at least two thin-film transistors, for example, three thin-film transistors 11, 12, and 13 shown in FIG. 2. At least two via holes 7 as shown in FIG. 3, for example, three via holes are prepared on the passivation layer 2 and the organic planarization layer 5 above the three thin-film transistors 11, 12, 13. Each via hole 7 passes through the passivation layer 2 and the organic planarization layer 5, but do not pass through the first color resist layer 3 and the second color resist layer 4.

Figure 4:
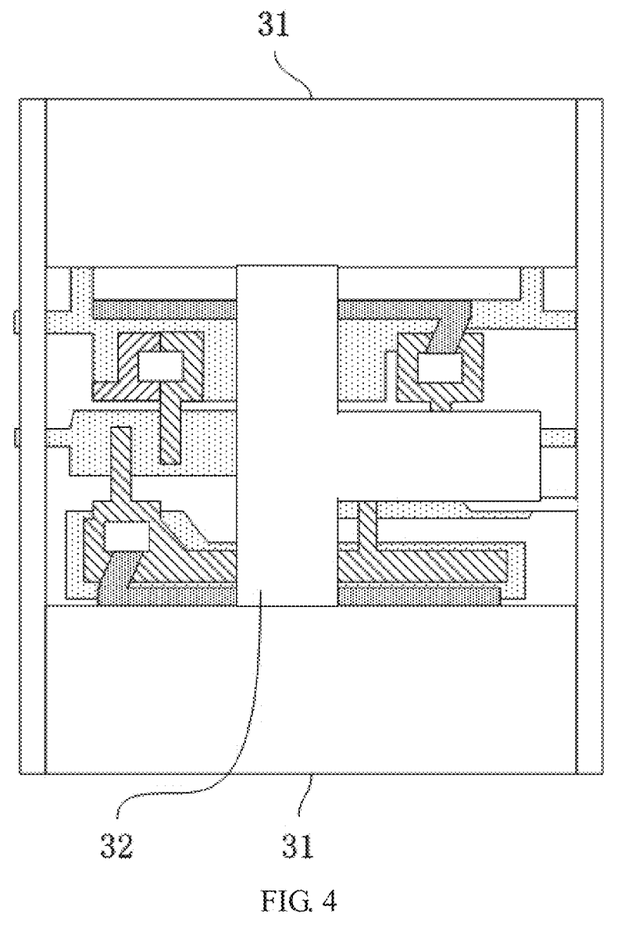
FIG. 4 is a schematic diagram of a first color resist region and a second color resist region in the first color resist layer provided by the present invention.

The first color resist layer 3 includes a first color resist region 31 as shown in FIG. 4, and multiple second color resist regions 32 connected to the first color resist region 31. The multiple second color resist regions 32 are respectively located above a first portion of the sub-pixel circuit of the multiple sub-pixel circuits 100.

A projection of the first color resist region 31 on the array substrate 1 is located at two sides of the sub-pixel circuit 100, and each second color resist region 32 is located above the at least two thin-film transistors, for example, above the thin-film transistors 11, 12, or above the thin-film transistors 12, 13, and the second color resist region 32 is staggered without contacting the at least two via holes 7 above the sub-pixel circuit 100. Specifically, a projection of the second color resist region 32 on the array substrate 1 is not overlapped with the electrodes for accessing the pixel electrode or the first common electrode of the at least two thin-film transistors of the sub-pixel circuit 100, and the at least two via holes 7 above the sub-pixel circuit 100 respectively correspond to the electrodes for accessing the pixel electrode or the first common electrode of the at least two thin-film transistors of the sub-pixel circuit 100. The second color resist layer 4 is stacked above the second color resist region 32.

Furthermore, the second color resist region has a T-shape, and the at least two via holes 7 are distributed at both sides of the second color resist region 32.

Furthermore, a pixel electrode 6 and a first common electrode 9 as shown in FIG. 3 are further disposed on the organic planarization layer 5, and the pixel electrode 6 and the first common electrode 9 are connected to a drain or a source of the thin-film transistor through the via hole 7 on the passivation layer 2 and the organic planarization layer 5.

Figure 6:
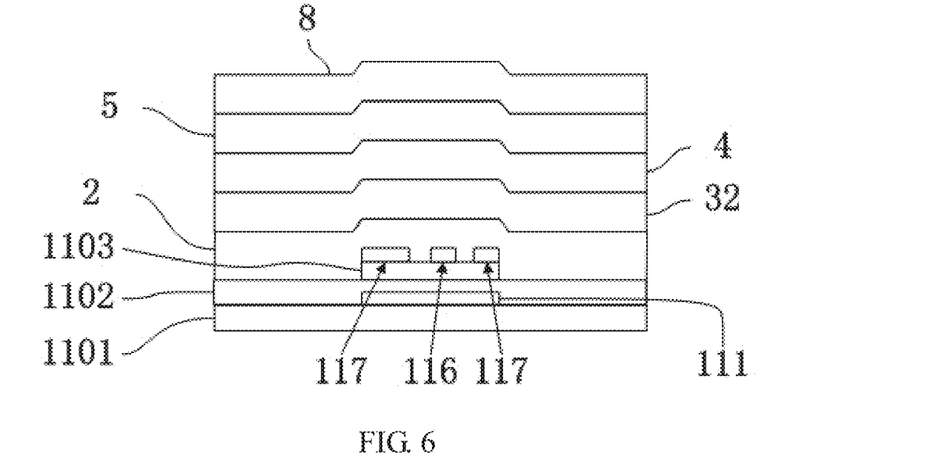
FIG. 6 is a cross-sectional view taken along the AA' line of FIG. 5 provided by the present invention.

Furthermore, a black matrix 8 as shown in FIG. 6 is further disposed above the organic planarization layer 5, and the black matrix 8 is located above a gate line on the array substrate 1. The second color resist region 32 and the second color resist layer 4 of the first color resist layer 3, and the organic planarization layer 5 and the black matrix 8 above the second color resist layer 4 commonly form a main region spacer.

Furthermore, each sub-pixel circuit 100 further includes a second common electrode 112, 113 located at both sides of the at least two thin-film transistors as shown in FIG. 3. The second common electrodes 112, 113, and gates of the at least two thin-film transistors are made of a same metal layer. Both the first common electrode 9 and the second common electrode 112, 113 are connected to a common electrical signal.

As shown in FIG. 3, the gate metal 111 of the thin-film transistors 11, 12, 13 and the second common electrodes 112, 113 are made of a same metal layer (a first metal layer), the drain 114 of the thin-film transistor 11, and the drain metal 115 of the thin-film transistor 11 and the thin-film transistor 12, the drain 116 of the thin-film transistor 13, the source metal 117 of the thin-film transistors 12 and 13, and the data line 118 on the array substrate 1 are made of a same metal layer (a second metal layer). The pixel electrode 6 and the first common electrode 9 are made of a same metal layer (a third metal layer). From bottom to top, the first metal layer, the second metal layer and the third metal layer are insulated.

As shown in FIG. 3, the via holes 7 are respectively provided above the source and drain electrodes 114 of the thin-film transistor 11, and one via hole 7 are formed above the drain electrode 116 of the thin-film transistor 13. The first common electrode 9 is connected to the drain 114 of the thin-film transistor 11 through the via hole 7. Two pixel electrodes 6 are respectively connected to the source of the thin-film transistor 11 and the drain 116 of the thin-film transistor 13 through the via hole 7.

As shown in FIG. 4, the second color resist region 32 is connected to the first color resist regions 31 on both sides to form a bridge structure, and a projection of the second color resist region 32 on the array substrate 1 can cover the gate metal 111 of thin-film transistors 12 and 13 shown in FIG. 6. Specifically, a portion of the second color resist region 32 is connected to the first color resist region 31 on both sides, and a portion of the second color resist region 32 is further protruded outward to increase the area of the second color resist region 32.

Figure 5:
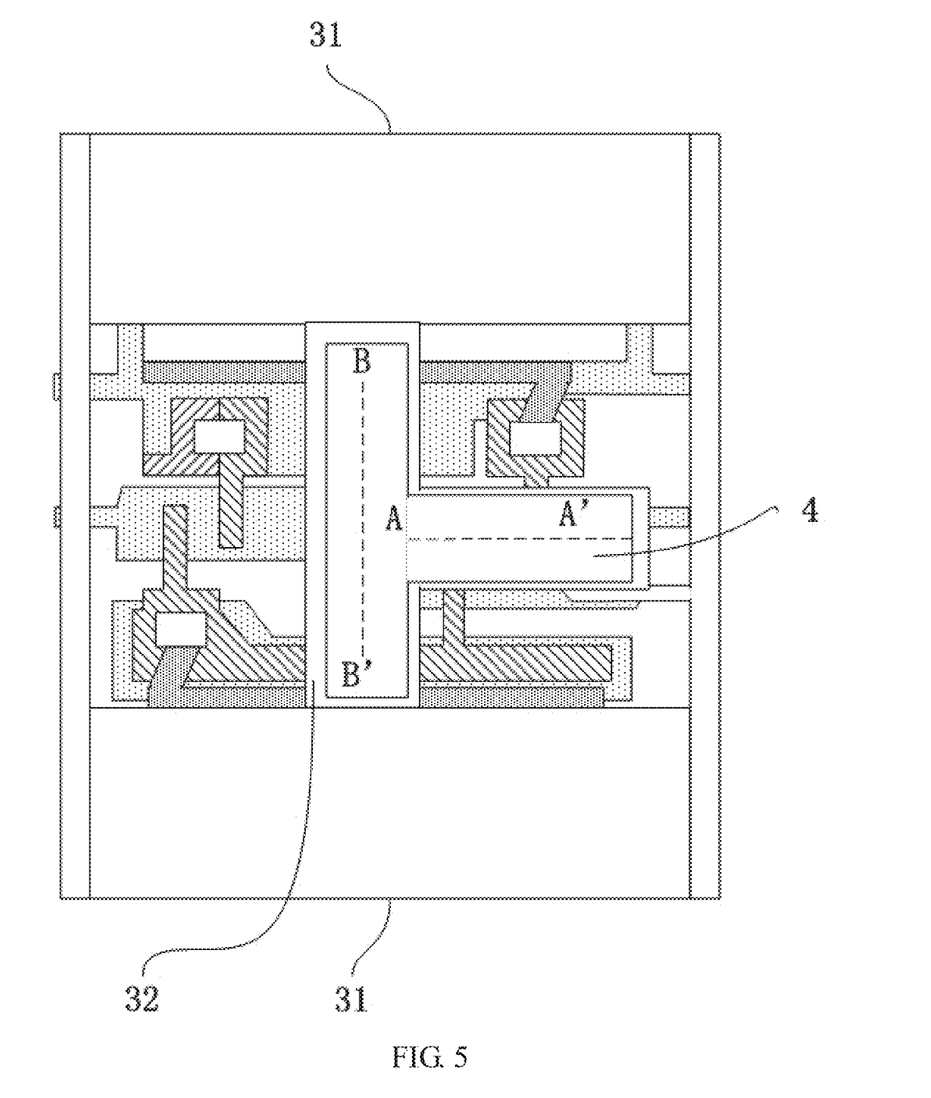
FIG. 5 is a schematic diagram of stacking a second color resist layer on the second color resist region of FIG. 4 provided by the present invention.

As shown in FIG. 5, the second color resist layer 4 is stacked above the second color resist region 32 of the first color resist layer 3. Of course, the second color resist layer 4 and the first color resist layer 3 are mutually different color resists. For example, the first color resist layer 3 may be a red color resist, and the second color resist layer 4 may be a green color resist.

Figure 7:
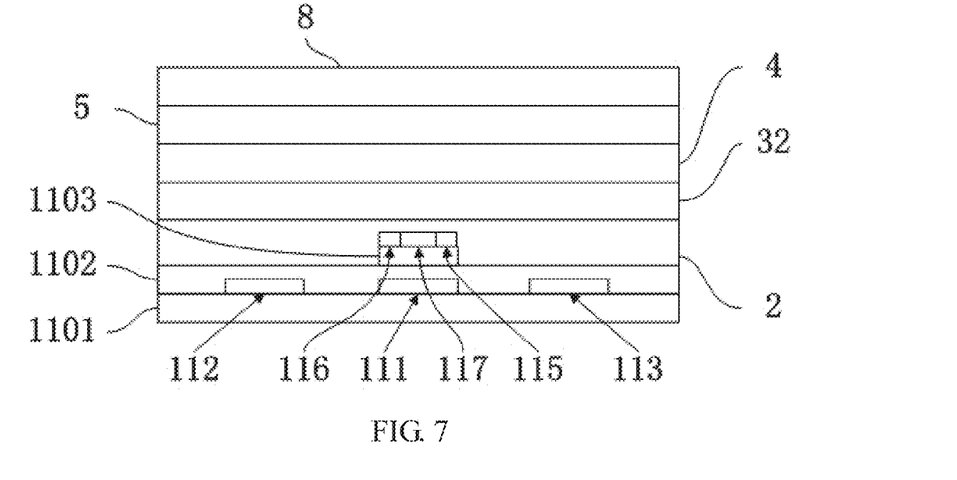
FIG. 7 is a cross-sectional view taken along line BB' of FIG. 5 provided by the present invention.

As shown in FIG. 6 and FIG. 7, the numeral 1101 is a glass substrate of the array substrate 1, the numeral 1102 is a gate insulation layer, the numeral 1103 is an active layer, the numeral 2 is a passivation layer, the numeral 32 is a color resist region, and the numeral 4 is a second color resist layer, the numeral 5 is an organic planarization layer, the numeral 8 is a black matrix.

The second color resist region 32 in the first color resist layer 3 may be staggered without overlapping the via hole 7 above the sub-pixel circuit 100, and the second color resist region 32 is also connected to the first color resist region 31 on both sides of the sub-pixel circuit 100 to form a bridge structure. Each of the second color resist region 32 is located above the at least two thin-film transistors to prevent the second resistive region 32 from being too small in area and insufficient in width. Accordingly, the second color resist region 32 in the present invention can better enhance the strength of the first color resist layer 3 relative to the island-shaped color resist or the bridge-shaped color resist strip, thereby avoiding easy breakage.

Moreover, the second color resist region 32 is located above the at least two thin-film transistors. Because the topography above the thin-film transistor is higher, therefore, the second color resistive region 32 and the second color resist layer 4 and the black matrix 8 stacked on the second color resistive region 32 can be used as a main region spacer, thereby ensuring the maximum terrain height at the place.

In addition, in the second color resist region 32 of the present invention, a slight misalignment occurs above or below the display panel with respect to a circular or square color resist or when the display panel is formed into a curved structure, since the second resistive region 32 has multiple dimensions, which can play a good supporting role.

Figure 8:
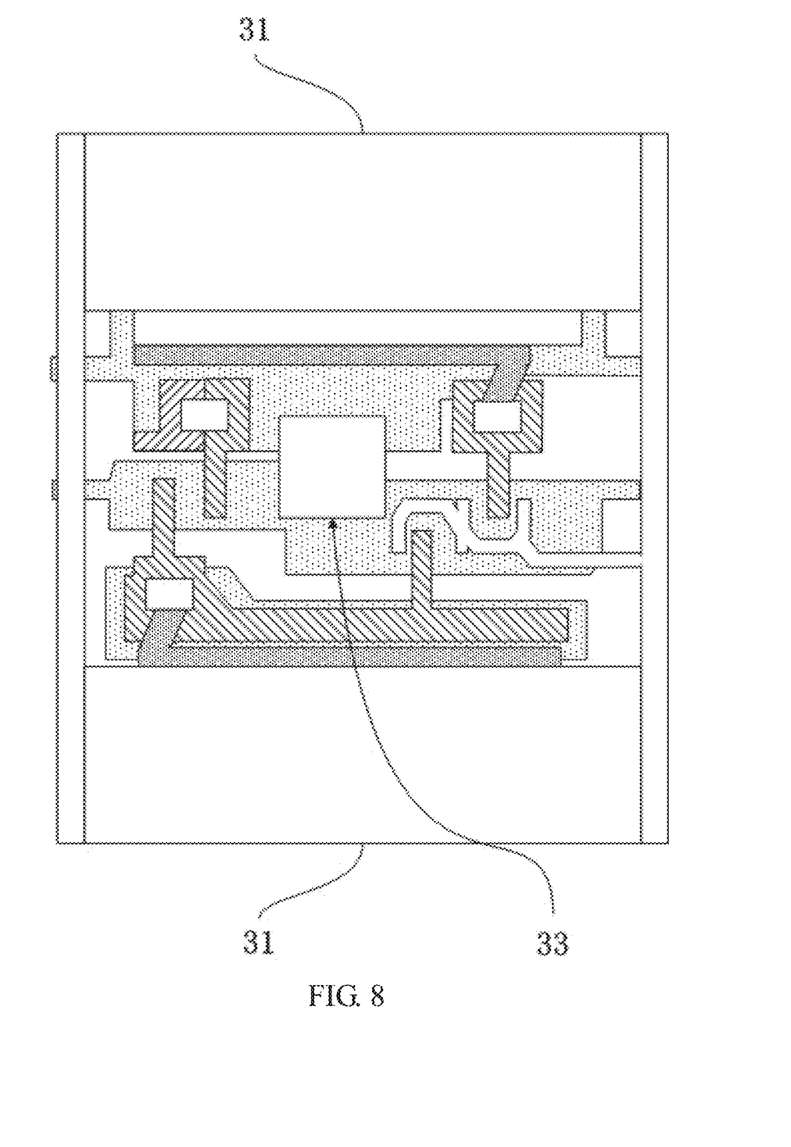
FIG. 8 is a schematic diagram of a third color resist region in the first color resist layer provided by the present invention.

Furthermore, the first color resist layer 3 further includes multiple island-shaped third color resist regions 33 as shown in FIG. 8, and the multiple island-shaped third color resist regions 33 are located above the thin-film transistor of a second portion of sub-pixel circuit of the multiple sub-pixel circuits 100, and the third color resist region 33 and the at least two via holes 7 are staggered. The third color resist region 33 of the first color resist layer 3 and the organic planarization layer 5 and the black matrix 8 above the third color resist region 33 commonly form a sub-region spacer. A step is formed between the main region spacer and the sub-region spacer.

Furthermore, the multiple island-shaped third color resist regions 33 and the multiple second color resist regions 32 are mutually intersected, and the number of the second color resist regions 32 is less than the number of the third color resist regions 33.

Figure 9:
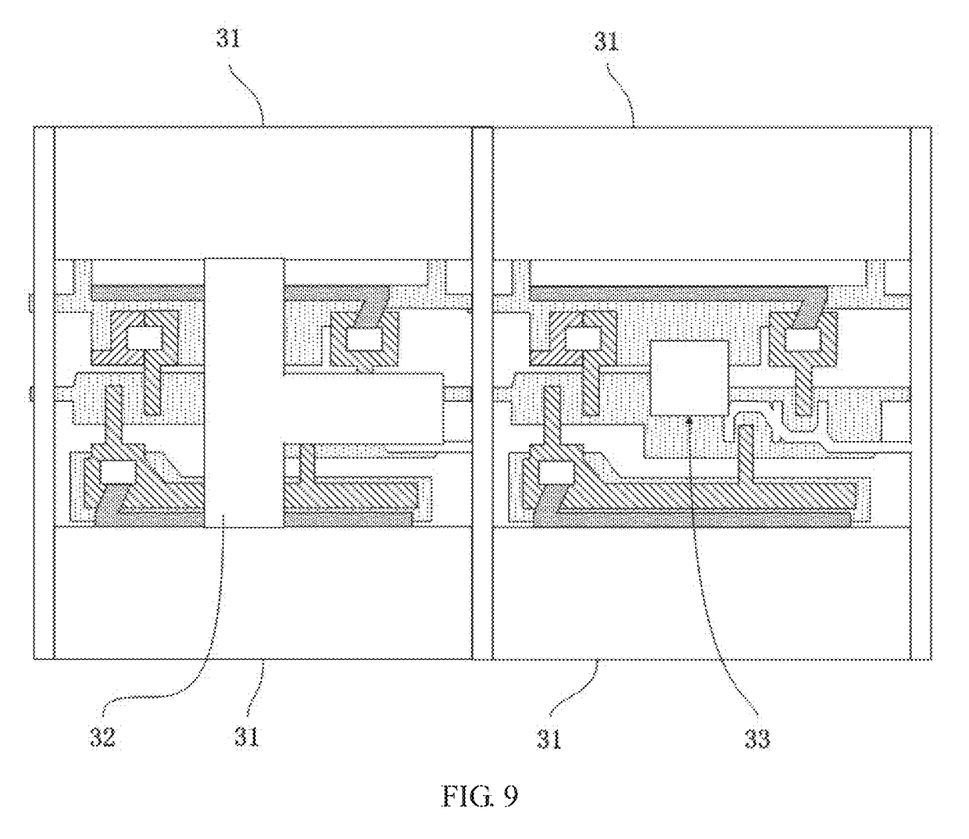
FIG. 9 is a schematic diagram of a first color resist layer disposed on two adjacent sub-pixel circuits provided by the present invention.

Generally, the array substrate of the display panel includes multiple pixel circuits, each of the pixel circuits includes three adjacent sub-pixel circuits 100, and a second color resist region 32 may be formed over one of the sub-pixel circuits 100, and a third color resist region 33 may be formed over the adjacent sub-pixel circuit 100, as shown in FIG. 9

The present invention further provides a manufacturing method for a display panel, and the manufacturing method comprises steps of:

providing an array substrate, wherein the array substrate includes multiple sub-pixel circuits, and each sub-pixel circuit includes at least two thin-film transistors;

forming a passivation layer on the array substrate;

forming a first color resist material layer, and patterning the first color resist material layer to obtain a first color resist layer, wherein the first color resist layer includes a first color resist region and multiple second color resist regions connected to the first color resist region, the multiple second color resist regions are respectively located above a first portion of the multiple sub-pixel circuits, a projection of the first color resist region on the array substrate is located at two sides of the sub-pixel circuit, each of the second color resist region is located above the at least two thin-film transistors, a projection of the second color resist region on the array substrate is not overlapped with electrodes of the at least two thin-film transistors of the sub-pixel circuit for connecting the pixel electrode or the first common electrode;

forming a second color resist material layer on the passivation layer, wherein the second color resist material layer covers the first color resist layer, and patterning the second color resist material layer to obtain a second color resist layer, wherein the second color resist layer is stacked above the second color resist region;

forming an organic planarization layer on the passivation layer, and the organic planarization layer covers the passivation layer;

etching to form at least two via holes on the organic planarization layer and the passivation layer above the sub-pixel circuit, each via hole penetrates through the passivation layer and the organic planarization layer, and the at least two via holes above each sub-pixel circuit are corresponding to electrodes of the at least two thin-film transistors of the sub-pixel circuit for connecting the pixel electrode or the first common electrode; thus, the second color resist region and the via hole can be staggered;

Furthermore, the manufacturing method for the display panel further includes the following steps:

forming a pixel electrode and a first common electrode on the organic planarization layer, and the pixel electrode and the first common electrode are connected to a source or a drain of the thin-film transistor through the via holes on the organic planarization layer and the passivation layer.

Furthermore, the manufacturing method for the display panel further includes the following steps:

using a black light-shielding material to manufacture a black matrix on the organic planarization layer, and the black matrix covers the pixel electrode and the first common electrode, and the black matrix is located above gate line of the array substrate. Here, the black light-shielding material selects a BPS material (Black photo spacer, black gap spacer control material).

In summary, in the display panel provided by the invention, the second color resist region on the first color resist layer is connected to the first color resist region on both sides of the sub-pixel circuit to form a bridge structure, and each second color resist region is further located above the at least two thin-film transistors to ensure that the region of the second color resist region is not too small. This can avoid the first color resist layer from breaking, and can also avoid the material leveling on both sides of the film layer stacked on the second color resist region. It is easy to form a higher topography, which is convenient to reach the expected topography height, and can form a step difference with the sub-region spacer.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A display panel, comprising:
an array substrate, a passivation layer on the array substrate, an organic planarization layer on the passivation layer, a first color resist layer and a second color resist layer, and the first color resist layer and the second color resist layer are clamped between the passivation layer and the organic planarization layer;
wherein the array substrate includes multiple sub-pixel circuits, and each sub-pixel circuit includes at least two thin-film transistors, at least two via holes are prepared on the passivation layer and the organic planarization layer;
wherein the first color resist layer includes a first color resist region and multiple second color resist regions connected to the first color resist region, and the multiple second color resist regions are respectively located above a first portion of the sub-pixel circuit of the multiple sub-pixel circuits; and
wherein a projection of the first color resist region on the array substrate is located at two sides of the sub-pixel circuit, and each second color resist region is located above the at least two thin-film transistors, the second color resist layer is stacked above the second color resist region;
wherein the first color resist layer further includes multiple island-shaped third color resist regions, and the multiple island-shaped third color resist regions are located above the thin-film transistor of a second portion of sub-pixel circuit of the multiple sub-pixel circuits, and the third color resist region and the at least two via holes are staggered.

2. The display panel according to claim 1, wherein the second color resist region has a T-shape, the second color resist region and the at least two via holes are staggered, and the at least two via holes are distributed at both sides of the second color resist region.

3. The display panel according to claim 1, wherein the multiple island-shaped third color resist regions and the multiple second color resist regions are mutually intersected, and the number of the second color resist regions is less than the number of the third color resist regions.

4. The display panel according to claim 1, wherein a pixel electrode and a first common electrode are further disposed on the organic planarization layer, and the pixel electrode and the first common electrode are connected to a drain or a source of the thin-film transistor through the via hole on the passivation layer and the organic planarization layer.

5. The display panel according to claim 1, wherein a black matrix is disposed above the organic planarization layer, and the black matrix is located above a gate line on the array substrate.

6. The display panel according to claim 1, wherein each sub-pixel circuit further includes a second common electrode located at both sides of the at least two thin-film transistors, the second common electrode and gates of the at least two thin-film transistors are made of a same metal layer.

7. A display panel, comprising:
an array substrate, a passivation layer on the array substrate, an organic planarization layer on the passivation layer, a first color resist layer and a second color resist layer, and the first color resist layer and the second color resist layer are clamped between the passivation layer and the organic planarization layer;
wherein the array substrate includes multiple sub-pixel circuits, and each sub-pixel circuit includes at least two thin-film transistors, at least two via holes are prepared on the passivation layer and the organic planarization layer;
wherein the first color resist layer includes a first color resist region and multiple second color resist regions connected to the first color resist region, and the multiple second color resist regions are respectively located above a first portion of the sub-pixel circuit of the multiple sub-pixel circuits;
wherein a projection of the first color resist region on the array substrate is located at two sides of the sub-pixel circuit, and each second color resist region is located above the at least two thin-film transistors, the second color resist layer is stacked above the second color resist region;
wherein the second color resist region has a T-shape, the second color resist region and the at least two via holes are staggered, and the at least two via holes are distributed at both sides of the second color resist region; and
wherein the first color resist layer further includes multiple island-shaped third color resist regions, and the multiple island-shaped third color resist regions are located above the thin-film transistor of a second portion of sub-pixel circuit of the multiple sub-pixel circuits, and the third color resist region and the at least two via holes are staggered.

8. The display panel according to claim 7, wherein the multiple island-shaped third color resist regions and the multiple second color resist regions are mutually intersected, and the number of the second color resist regions is less than the number of the third color resist regions.

9. The display panel according to claim 7, wherein a pixel electrode and a first common electrode are further disposed on the organic planarization layer, and the pixel electrode and the first common electrode are connected to a drain or a source of the thin-film transistor through the via hole on the passivation layer and the organic planarization layer.

10. The display panel according to claim 7, wherein a black matrix is disposed above the organic planarization layer, and the black matrix is located above a gate line on the array substrate.

11. The display panel according to claim 7, wherein each sub-pixel circuit further includes a second common electrode located at both sides of the at least two thin-film transistors, the second common electrode and gates of the at least two thin-film transistors are made of a same metal layer.

* * * * *